United States Patent
Kim et al.

(10) Patent No.: US 9,125,292 B2
(45) Date of Patent: Sep. 1, 2015

(54) PANORAMA DISPLAY DEVICE, METHOD OF MANUFACTURING THE PANORAMA DISPLAY DEVICE, AND DISPLAY DEVICE

(71) Applicants: Tae-Jin Kim, Yongin (KR); Hae-Kwan Seo, Yongin (KR)

(72) Inventors: Tae-Jin Kim, Yongin (KR); Hae-Kwan Seo, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 116 days.

(21) Appl. No.: 13/673,026

(22) Filed: Nov. 9, 2012

(65) Prior Publication Data

US 2013/0342975 A1  Dec. 26, 2013

(30) Foreign Application Priority Data

Jun. 26, 2012 (KR) .......................... 10-2012-0068706

(51) Int. Cl.

| | |
|---|---|
| G06F 1/16 | (2006.01) |
| H05K 5/00 | (2006.01) |
| H05K 7/00 | (2006.01) |
| H01J 9/00 | (2006.01) |
| G09F 9/30 | (2006.01) |
| G06F 3/14 | (2006.01) |
| H01L 51/52 | (2006.01) |
| H01L 27/32 | (2006.01) |

(52) U.S. Cl.
CPC ............ *H05K 5/0017* (2013.01); *G06F 3/1446* (2013.01); *G09F 9/301* (2013.01); *H01J 9/00* (2013.01); *H01L 27/3293* (2013.01); *H01L 51/5281* (2013.01); *H01L 2251/5338* (2013.01)

(58) Field of Classification Search
CPC ... G06F 1/1616; G06F 1/1637; G06F 1/1601; G06F 1/162; G06F 1/1641; H05K 7/1452

USPC .............. 361/679.01, 679.21, 679.26–679.29
See application file for complete search history.

(56) References Cited

U.S. PATENT DOCUMENTS

| | | | | |
|---|---|---|---|---|
| 6,107,988 | A * | 8/2000 | Phillipps ........................ | 345/156 |
| 6,886,751 | B2 * | 5/2005 | Silverbrook ............. | 235/472.01 |
| 7,460,198 | B2 * | 12/2008 | Nagai et al. .................... | 349/117 |

(Continued)

FOREIGN PATENT DOCUMENTS

| | | |
|---|---|---|
| JP | 07-128652 | 5/1995 |
| JP | 2012-054056 | 3/2012 |

(Continued)

OTHER PUBLICATIONS

Korean Certificate of Determination dated Sep. 26, 2014.

*Primary Examiner* — Bernard Rojas
(74) *Attorney, Agent, or Firm* — Lee & Morse, P.C.

(57) ABSTRACT

A panorama display device includes a first display panel flexibly hinged to provide a hinged part and a non-hinged part of the first display panel, a first polarization unit on the first display panel, the first polarization unit including a separated part separated from a remaining part of the first polarization unit, a second display panel flexibly hinged to provide a hinged part and a non-hinged part of the second display panel, and a second polarization unit on the second display panel, the second polarization unit including a separated part separated from a remaining part of the second polarization unit. The hinged part of the first display panel is hinged with the separated part of the first polarization unit. The hinged part of the second display panel is hinged with the separated part of the second polarization unit. The first and second display panels are connected to each other.

14 Claims, 5 Drawing Sheets

(56) References Cited

U.S. PATENT DOCUMENTS

| | | | |
|---|---|---|---|
| 7,777,856 B2 | 8/2010 | Silverbrook | |
| 2003/0189759 A1 | 10/2003 | Kim et al. | |
| 2004/0051944 A1* | 3/2004 | Stark | 359/448 |
| 2007/0097014 A1 | 5/2007 | Solomon et al. | |
| 2011/0120755 A1 | 5/2011 | Lee et al. | |

FOREIGN PATENT DOCUMENTS

| | | |
|---|---|---|
| KR | 2002-0022216 | 3/2002 |
| KR | 10-2003-0032544 A | 4/2003 |
| KR | 10-2006-0069160 A | 6/2006 |
| KR | 10-2007-0040699 A | 4/2007 |
| KR | 10-2011-0057985 | 6/2011 |

* cited by examiner

PANORAMA DISPLAY DEVICE, METHOD OF MANUFACTURING THE PANORAMA DISPLAY DEVICE, AND DISPLAY DEVICE

CROSS-REFERENCE TO RELATED PATENT APPLICATION

This application claims the benefit under 35 U.S.C. §119 of Korean Patent Application No. 10-2012-0068706, filed on Jun. 26, 2012, in the Korean Intellectual Property Office, the disclosure of which is incorporated herein in its entirety by reference.

BACKGROUND

1. Field

Embodiments relate to a panorama display device and a method of manufacturing the panorama display device, and a display device.

2. Description of the Related Art

In general, flexible display devices are bendable. A flexible display device may include a display panel and a bezel portion formed on the display panel.

SUMMARY

Embodiments are directed to a panorama display device including a first display panel that is flexibly hinged to provide a hinged part and a non-hinged part of the first display panel, a first polarization unit on the first display panel, the first polarization unit including a separated part that is separated from a remaining part of the first polarization unit, a second display panel that is flexibly hinged to provide a hinged part and a non-hinged part of the second display panel, and a second polarization unit on the second display panel, the second polarization unit including a separated part that is separated from a remaining part of the second polarization unit. The hinged part of the first display panel is hinged with the separated part of the first polarization unit. The hinged part of the second display panel is hinged with the separated part of the second polarization unit. The first and second display panels are connected to each other.

The panorama display device may further include an adhesive member between the separated part of the first polarization unit and the separated part of the second polarization unit, the adhesive member attaching the first and second polarization units to each other.

The panorama display device may further include a coupling member surrounding the hinged part of the first display panel and the hinged part of the second display panel to couple the first and second display panels to each other.

The panorama display device may further include a connecting member formed on the remaining part of the first polarization unit and the remaining part of the second polarization unit.

The connecting member may include at least one of an optically clear adhesive (OCA), a glass member, and a touch screen panel (TSP).

The panorama display device may further include a bezel portion on at least one of the first and second display panels.

At least one of the separated part of the first polarization unit and the separated part of the second polarization unit may be located on the bezel portion.

At least one of the first polarization unit and the second polarization unit may be formed by sequentially stacking triacetate cellulose (TAC), polyvinyl alcohol (PVA), TAC, and a retardation film.

Embodiments are also directed to a method of manufacturing a panorama display device, including preparing a first display panel including a first polarization unit and a second display panel including a second polarization unit, cutting the first polarization unit and the second polarization unit by as much as thicknesses of the first and second polarization units to provide a cut portion of the first polarization unit and a cut portion of the second polarization unit, and hinging the first and second display panels to provide a hinged and a non-hinged portion of the first display panel and a hinged portion and a non-hinged portion of the second display panel, and coupling the cut portion of the first polarization unit and the cut portion of the second polarization unit to each other.

At least one of the first and second polarization units may be cut by a laser or a cutting wheel.

The cut portion of the first polarization unit may be located on the hinged portion of the first display panel. The cut portion of the second polarization unit may be located on the hinged portion of the second display panel. The cut portion of the first polarization unit and the cut portion of the second polarization unit may be coupled to each other by an adhesive member.

The hinged portion of the first display panel, the cut portion of the first polarization unit, the hinged portion of the second display panel, and the cut portion of the second polarization unit may be fixed by using a coupling member.

The method may further include fixing the first display panel and the second display panel by forming a connecting member on the non-hinged portion of the first polarization unit and the non-hinged portion of the second polarization unit.

The connecting member may include at least one of an optically clear adhesive (OCA), a glass member, and a touch screen panel (TSP).

Embodiments are also directed to a display device including a display panel that is flexible, a bezel portion on the display panel, and a polarization unit on the display panel. The polarization unit may include a separated part that is separated from other portions of the polarization unit. The display panel may be hinged at the separated part of the polarization unit.

The separated part of the polarization unit may be located on the bezel portion.

A thickness of the separated part of the polarization unit may be equal to a thickness of a remaining part of the polarization unit.

BRIEF DESCRIPTION OF THE DRAWINGS

Features will become apparent by describing in detail exemplary embodiments thereof with reference to the attached drawings in which.

DETAILED DESCRIPTION

Hereinafter, embodiments will be described more fully with reference to the accompanying drawings, in which exemplary embodiments of the invention are shown. However, they may be embodied in many different forms and should not be construed as limited to the exemplary embodiments set forth herein. Rather, these embodiments are provided so that this disclosure will be thorough and complete, and will fully convey the scope of the invention to those skilled in the art. The terminology used herein is for the purpose of describing particular embodiments only and is not intended to be limiting of the invention.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Figure 1:
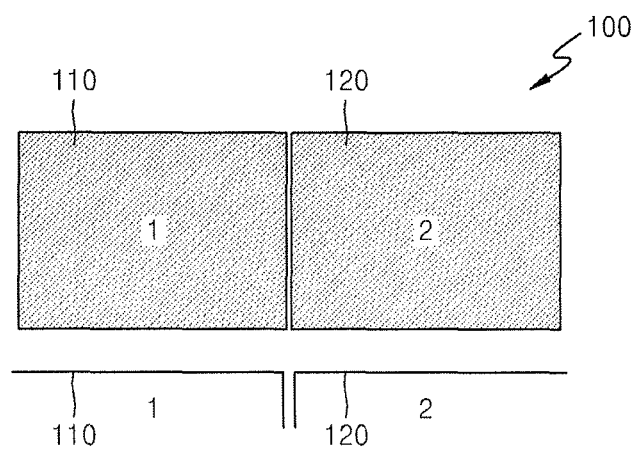
FIG. 1 is a conceptual view of a panorama display device according to an embodiment.
Figure 2:
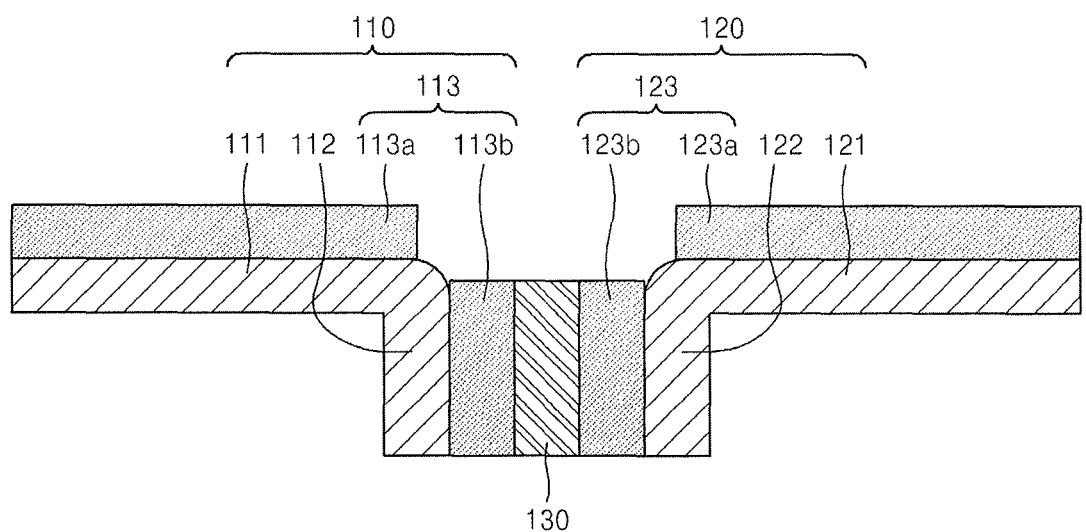
FIG. 2 is a cross-sectional view of a first display device and a second display device shown in FIG. 1.
Figure 3A:
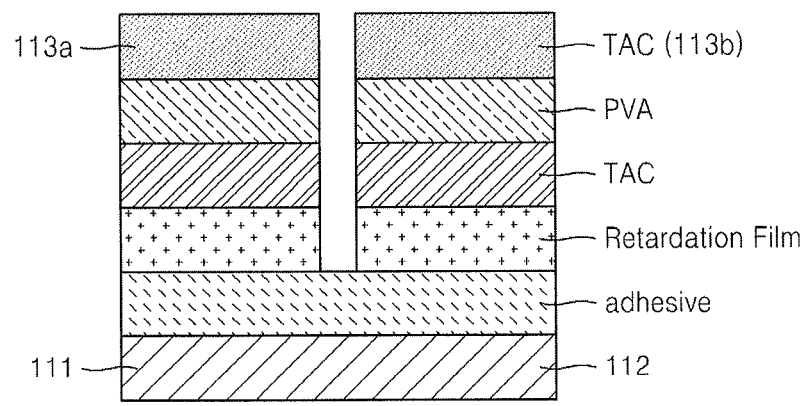
FIGS. 3A and 3B are cross-sectional views of the first display device of FIG. 2.
Figure 3B:
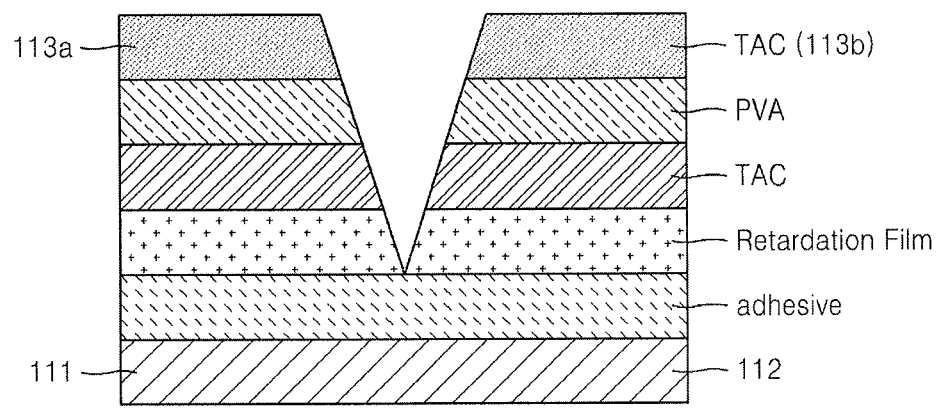

FIG. 1 is a conceptual view of a panorama display device 100 according to an embodiment. FIG. 2 is a cross-sectional view of a first display device 110 and a second display device 120 shown in FIG. 1. FIGS. 3A and 3B are cross-sectional views of the first display device 110 of FIG. 2.

Referring to FIGS. 1 through 3, the panorama display device 100 may include display devices connecting to each other. The display devices may include the first display device 100 and the second display device 120 connected to the first display device 110.

The first display device 110 may include a first display panel 111 that is flexibly hinged. The first display panel 111 may include a flexible organic light-emitting diode (OLED) display.

In particular, the first and second display devices 110 and 120 may be flexible display devices using self-emissive devices. In detail, a flexible display device using a self-emissive device may use various devices such as an OLED, quantum dots, or the like. Hereinafter, a flexible display device using an OLED will be described as an example of the flexible display device using a self-emissive device for convenience of description.

In addition, the first display device 110 may include a first polarization unit 113 formed on the first display panel 111. The first polarization unit 113 may be formed to have separated portions. For example, the first polarization unit 113 may include a first polarization member 113a formed on a part of the first display panel 111. Also, the first polarization unit 113 may include a second polarization member 113b formed on another part of the first display panel 111.

The second polarization member 113b may be formed on a hinged portion of the first display panel 111, which will be described below. In particular, the second polarization member 113b may be formed on a bezel portion of the first display panel 111, which will be described below.

The second display device 120 may include a second display panel 121 that is disposed in parallel with the first display panel 111. Here, since the second display panel 121 is substantially the same as the first display panel 111, detailed descriptions thereof will not be repeated.

The second display device 120 may include a second polarization unit 123 formed on the second display panel 121. The second polarization unit 123 may have separated portions.

For example, the second polarization unit 123 may include a third polarization member 123a formed on a part of the second display panel 121. In addition, the second polarization unit 123 may include a fourth polarization member 123b formed on another part of the second display panel 121 and separated by a predetermined distance from the third polarization member 123a.

The first and second polarization units 113 and 123 may be attached respectively to the first display panel 111 and the second display panel 121 by adhesives. The adhesive may be a generally used adhesive.

The first and second polarization members 113a and 113b may be separated a predetermined distance from each other, as described above. Also, the third and fourth polarization members 123a and 123b may be separated a predetermined distance from each other, as described above.

There may be spaces between the first and second polarization members 113a and 113b and between the third and fourth polarization members 123a and 123b. In particular, the spaces may be variously formed according to a cutting apparatus. For example, the space may have a square cross-section if the cutting apparatus uses laser, otherwise, the space may have a triangular or a parallelogram cross-section if the cutting apparatus is a cutting wheel.

The first and second polarization units 113 and 123 may be formed partially connected to each other. In detail, the second polarization member 113b formed on the hinged portion of the first display panel 111 and the fourth polarization member 123b formed on the hinged portion of the second display panel 121 may be connected to each other.

The first through fourth polarization members 113a through 123b may be formed in the same manner. For example, at least one of the first through fourth polarization members 113a through 123b may have a structure in which triacetate cellulose (TAC), polyvinyl alcohol (PVA), the TAC, and a retardation film are sequentially stacked. Hereinafter, for the convenience of description, it is assumed that the first through fourth polarization members 113a through 123b are formed by sequentially stacking the above materials.

The panorama display device 100 may include an adhesive member 130 disposed between the second polarization member 113b and the fourth polarization member 123b. The adhesive member 130 includes an adhesive for attaching the second and fourth polarization members 113b and 123b to each other.

The first and second display devices 110 and 120 may include the bezel portion that is formed on at least one of the first and second display panels 121. A plurality of bezel portions may be formed.

For example, the bezel portion may include a first bezel portion 112 forming a boundary of the first display panel 111. In addition, the bezel portion may include a second bezel portion 122 forming a boundary of the second display panel 121.

In particular, the first and second bezel portions 112 and 122 may be foil led when the first and second display panels 111 and 121 are manufactured. In addition, the first and second bezel portions 112 and 122 may be physical portions where a touch sensor or the like is not formed, and thus may not receive signals from outside.

The separated portion of the first polarization unit 113 may be formed on the first bezel portion 112. In more detail, the space between the first polarization members 113a and the second polarization member 113b may be formed on the first bezel portion 112. Here, the space between the first polarization member 113a and the second polarization member 113b may coincide with an inner boundary of the first bezel portion 112.

Also, the space between the third and fourth polarization members 123a and 123b may be formed on the second bezel portion 122. Here, the space between the third and fourth polarization members 123a and 123b may coincide with an inner boundary of the second bezel portion 122.

A method of manufacturing the panorama display device 100 will be described in detail as follows:

Preparing of a first display panel and a second display panel

The first and second display panels 111 and 121 are prepared to manufacture the panorama display device 100. The first and second display panels 111 and 121 may be formed as flexible displays as described above. In particular, the first and second display panels 111 and 121 may be flexible OLED displays.

The first and second display panels 111 and 121 may have similar structure and shape as those of a general flexible OLED display.

When the first and second display panels 111 and 121 described above are prepared, the first polarization unit 113 may be formed on a surface of the first display panel 111. In addition, the second polarization unit 123 may be formed on a surface of the second display panel 121.

The first and second polarization units 113 and 123 may be formed in a general way of forming a polarization unit on a display panel. In detail, the first and second polarization units 113 and 123 may be formed as films to be attached respectively on the first display panel 111 and the second display panel 121.

Cutting of First Polarization Unit and Second Polarization Unit

When the above operation is finished, each of the first and second polarization units 113 and 123 may be cut. Each of the first and second polarization units 113 and 123 may be cut in various ways.

In detail, each of the first and second polarization units 113 and 123 may be cut by laser. In other implementations, each of the first and second polarization units 113 and 123 may be cut by a cutting wheel.

The first polarization unit 113 may be separated into the first polarization member 113a and the second polarization member 113b through the cutting operation. In addition, the second polarization unit 123 may be separated into the third polarization member 123a and the fourth polarization member 123b through the cutting operation.

In particular, when each of the first and second polarization units 113 and 123 is separated, the first and second polarization units 113 and 123 may be cut by as much as a thickness of the first and second polarization units 113 and 123. In more detail, the first polarization unit 113 may be cut into a portion adhered to the first display panel 111 so as to be formed on the first display panel 111. In addition, the second polarization unit 123 may be cut into a portion adhered to the second display panel 121 so as to be formed on the second display panel 121.

Coupling of First Display Panel and Second Display Panel

After cutting the first and second polarization units 121 and 123 as described above, the first and second display panels 111 and 121 may be hinged with each other. The first display panel 111 may be hinged based on a portion where the first polarization unit 113 is separated, that is, the space between the first polarization member 113a and the second polarization member 113b. In addition, the second display panel 121 may be hinged based on a portion where the second polarization unit 123 is separated, that is, the space between the third and fourth polarization members 123a and 123b.

In particular, as described above, the space between the first polarization member 113a and the second polarization member 113b corresponds to the boundary of the first bezel portion 112, and thus, the first bezel portion 112 may be hinged. In addition, since the space between the third and fourth polarization members 123a and 123b is formed on the boundary of the second bezel portion 122, the second bezel portion 122 may be hinged.

Through the above processes, the first and second display devices 110 and 120 may be manufactured. The first and second display devices 110 and 120 may be installed and used on separate electronic devices.

Therefore, the first bezel portion 112 of the first display device 110 and the second bezel portion 122 of the second display device 120 are hinged with each other, and thus, the bezel portion may be minimized. In particular, if at least one of the first and second display devices 110 and 120 is used in an electronic device, the bezel portion of the electronic device may be minimized, thereby improving the reliability of a product and realizing a high-end product.

As described above, after hinging the first and second display panels 111 and 121 with each other, the first and second display panels 111 and 121 may be coupled to each other. The adhesive member 130 may be disposed between the hinged portion of the first display panel 111 and the hinged portion of the second display panel 121 to attach the first and second display panels 111 and 121 to each other.

In detail, the adhesive member 130 is applied between the second polarization member 113b formed on the first bezel portion 112 and the fourth polarization member 123b formed on the second bezel portion 122, and then, the second and fourth polarization members 113b and 123b may be attached to each other.

After finishing the above attaching process, at least one of a cover window, a touch screen panel (TSP), and an optically clear adhesive (OCA) may be formed on the first and third polarization members 113a and 123a.

Therefore, loss of the image on the connected portion in the panorama display device 100 may be reduced by bending the bezel portions formed on the displays and connecting the bezel portions to each other.

Figure 4:
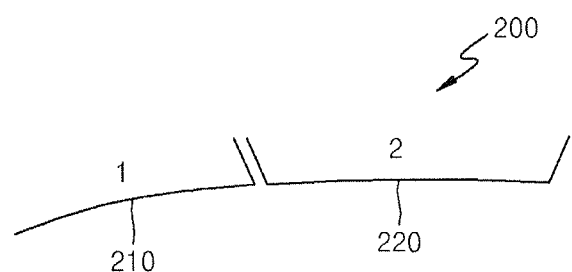
FIG. 4 is a conceptual view of a panorama display device according to another embodiment.
Figure 5:
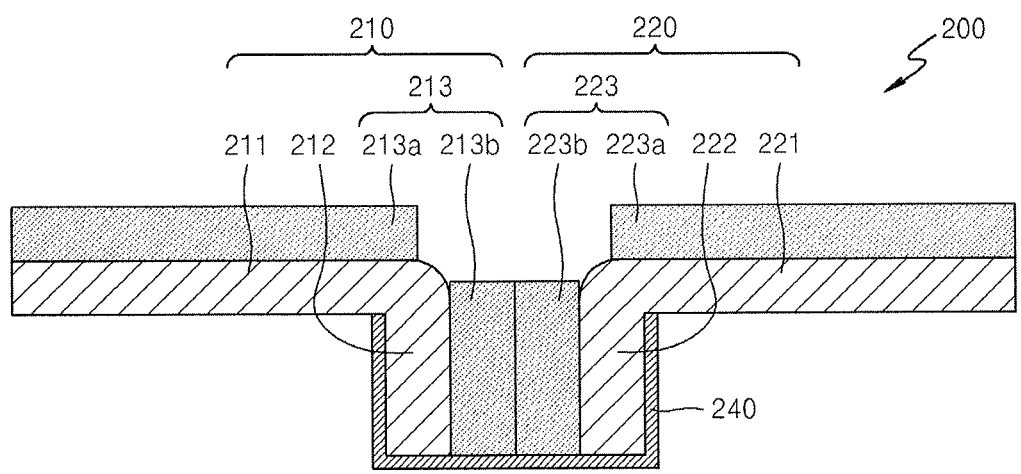
FIG. 5 is a cross-sectional view of a first display device and a second display device shown in FIG. 4.

FIG. 4 is a conceptual view of a panorama display device 200 according to another embodiment. FIG. 5 is a cross-sectional view of a first display device 210 and a second display device 220 shown in FIG. 4.

Referring to FIGS. 4 and 5, the panorama display device 200 may include the first display device 210 and the second display device 220. The first display device 210 includes a first display panel 211, a first polarization unit 213, and a first bezel portion 212. The second display device 220 may include a second display panel 221, a second polarization unit 223, and a second bezel portion 222.

The first and second display devices 210 and 220 are substantially the same as those of the above embodiment, and detailed descriptions thereof will not be repeated here.

The panorama display device 200 may be formed to be curved. In detail, the panorama display device 200 may be curved by installing the first and second display devices 210 and 220 to be curved.

The panorama display device 200 may include a coupling member 240 for coupling the first and second display devices 210 and 220 to each other by surrounding parts of the first and second display devices 210 and 220.

In detail, the coupling member 240 may be formed to surround parts of the first and second display panels 211 and 221. In particular, the coupling member 240 may be installed to surround a bent portion of the first display panel 211, a second polarization member 213b, a bent portion of the second display panel 221, and a fourth polarization member 223b.

The coupling member 240 may be formed of various materials. For example, the coupling member 240 may be formed of synthetic resin, metal, and silicon.

Also, the coupling member 240 may be formed to have various shapes. The coupling member 240 may be formed in any suitable shape provided that parts of the first and second display devices 210 and 220 may be coupled to each other. For example, the coupling member 240 may be formed in a clip or a U-shape In a case where the coupling member 240 is installed as described above, an adhesive member may be provided between the second and fourth polarization members 213b and 223b. Hereinafter, a case where the first and second display devices 210 and 220 are coupled to each other by using the coupling member 240 will be described in detail for the convenience of description.

A method of manufacturing the panorama display device 200 will be described as follows:

Preparing of First Display Panel and Second Display Panel

In order to manufacture the panorama display device 200, the first and second display devices 210 and 220 are prepared. The first and second display devices 210 and 220 may be manufactured in the same way as that of the previous embodiment, and thus, detailed descriptions will not be repeated here.

In detail, as described above, the first display panel 211 is prepared, and the first polarization unit 213 that is formed as a film may be attached to the first display panel 211. In addition, the second display panel 221 is prepared, and the second polarization unit 223 that is formed as a film may be attached to the second display panel 221.

Cutting of First Polarization Unit and Second Polarization Unit

When the first and second display devices 210 and 220 are prepared as described above, the first polarization unit 213 and the second polarization unit 223 may be cut. Since the process of cutting the first and second polarization units 213 and 223 is substantially the same as that of the previous embodiment, a detailed description will not be repeated.

As described above, when the first and second polarization units 213 and 223 are cut, the first polarization unit 213 may be separated into the first polarization member 213a and the second polarization member 213b. In addition, the second polarization unit 223 may be separated into the third polarization member 223a and the fourth polarization member 223b.

Connecting First Display Panel and Second Display Panel to Each Other

After cutting the first and second polarization units 213 and 223 as described above, the first and second display panels 211 and 221 may be hinged with each other. Here, the first and second display panels 211 and 221 may be hinged in the same way as that of the previous embodiment, and thus, detailed descriptions will not be repeated.

When the first and second display panels 211 and 221 are hinged with each other, the hinged portion of the first display panel 211 and the hinged portion of the second display panel 221 may be inserted in the coupling member 240.

When the first and second display panels 211 and 221 are inserted in the coupling member 240, a protruding portion of the coupling member 240 applies a force to the second and fourth polarization members 213b and 223b to connect the first and second display panels 211 and 221 to each other. In particular, the first bezel portion 212 and the second bezel portion 222 may be located in the coupling member 240.

When the coupling is finished, at least one of the cover window, the TSP, and the OCA may be formed on the first and third polarization units 213a and 223a as described above.

Therefore, according to the panorama display device 200 of the present embodiment, loss of an image on the connected portion between the two display devices may be reduced by bending and hinging the bezel portions formed on the displays.

Figure 6:
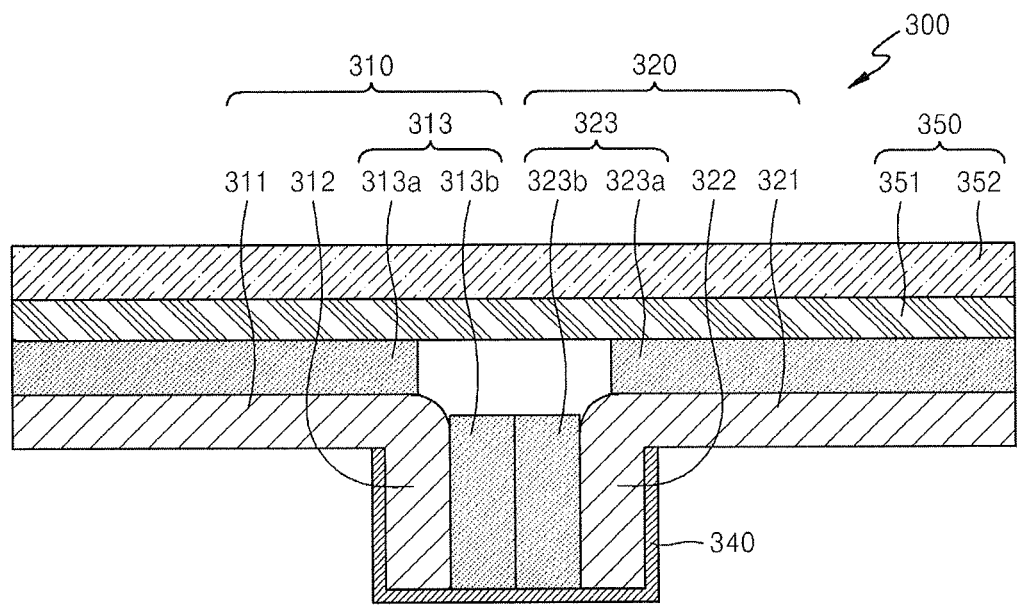
FIG. 6 is a cross-sectional view of a panorama display device according to another embodiment.

FIG. 6 is a cross-sectional view of a panorama display device 300 according to another embodiment.

Referring to FIG. 6, the panorama display device 300 may include a first display device 310, a second display device 320, and a coupling member 340. The first display device 310 may include a first display panel 311, a first polarization portion 313, and a first bezel portion 312, and the second display device 320 may include a second display panel 321, a second polarization unit 323, and a second bezel portion 322. Here, the first display device 310, the second display device 320, and the coupling member 340 are substantially the same as of the previous embodiment, and thus, detailed descriptions thereof will not be repeated.

The panorama display device 300 may include a connecting member 350 formed on the first and second polarization units 313 and 323. The connecting member 350 may be formed in various ways. For example, the connecting member 350 may include at least one of an OCA 351, a glass member 352, and a touch screen panel (TSP) (not shown).

In particular, the connecting member 350 may be formed by sequentially stacking the OCA 351 or the glass member 352, or the OCA 351 and the TSP. Hereinafter, for convenience of description, a case where the connecting member 350 is formed by stacking the OCA 351 and the glass member 352 sequentially will be described in detail.

Preparing of First Display Panel and Second Display Panel

In order to manufacture the panorama display device 300, the first and second display devices 310 and 320 are prepared. Here, the first and second display devices 310 and 320 may be manufactured in the same way as that of the previous embodiment, and thus, detailed descriptions will not be repeated here.

In detail, as described above, the first display panel 311 is prepared, and the first polarization unit 313 that is formed as a film may be attached to the first display panel 311. In addition, the second display panel 321 is prepared, and the second polarization unit 323 that is formed as a film may be attached to the second display panel 321.

Cutting of First Polarization Unit and Second Polarization Unit

When the first and second display devices 310 and 320 are prepared as described above, the first polarization unit 313 and the second polarization unit 323 may be cut. Here, since the process of cutting the first and second polarization units 313 and 323 is substantially the same as that of the previous embodiment, a detailed description will not be repeated.

As described above, when the first and second polarization units 313 and 323 are cut, the first polarization unit 313 may be separated into a first polarization member 313a and a second polarization member 313b. In addition, the second polarization unit 323 may be separated into a third polarization member 323a and a fourth polarization member 323b.

Connecting First Display Panel and Second Display Panel to Each Other

After cutting the first and second polarization units 313 and 323 as described above, the first and second display panels 311 and 321 may be hinged with each other. Here, the first and second display panels 311 and 321 may be hinged in the same way as that of the previous embodiment, and thus, detailed descriptions will not be repeated.

When the first and second display panels 311 and 321 are hinged with each other, the hinged portion of the first display panel 311 and the hinged portion of the second display panel 321 may be inserted in the coupling member 340. The process of the connecting the first and second display panels 311 and 321 to each other via the coupling member 340 is substantially the same as that of the previous embodiment, and thus, detailed descriptions will not be repeated.

In particular, when the first and second display panels 311 and 321 are coupled to each other as described above, the first bezel portion 312 and the second bezel portion 322 may be inserted in the coupling member 340.

Connecting First and Second Display Devices by Connecting Member

When the coupling operation is finished, as described above, the OCA 351 and the glass member 352, or the OCA 351 and the TSP may be sequentially formed on the first and third polarization members 313a and 323a.

Here, a method of forming the OCA 351 and the glass member 352 or the OCA 351 and the TSP may be the same as a general method.

In a case where the OCA 351 and the glass member 352 are formed, the OCA 351 and the glass member 352 may be formed to extend toward the first and third polarization members 313a and 323a. In detail, the OCA 351 and the glass member 352 are formed on the first polarization member 313a and extend to the third polarization member 323a, and may be formed to cover the hinged portions of the first display panel 311 and the second display panel 321. In particular, the connecting member 350 may be formed to cover the coupling portion between the first bezel portion 312 and the second bezel portion 322.

When the panorama display device 300 is manufactured as above, the first and second display panels 311 and 321 may be connected to each other via the coupling member 340, and moreover, may be fixed to each other by the connecting member 350.

Therefore, according to the panorama display device 300 of the present embodiment, the bezel portions are bent and hinged to be connected to each other, and thus, loss of an image on the connected portion may be reduced. In particular, since the first and second display devices 310 and 320 in the panorama display device 300 are connected to each other by the connecting member 350, the first and second display devices 310 and 320 may be firmly connected to each other.

Figure 7:
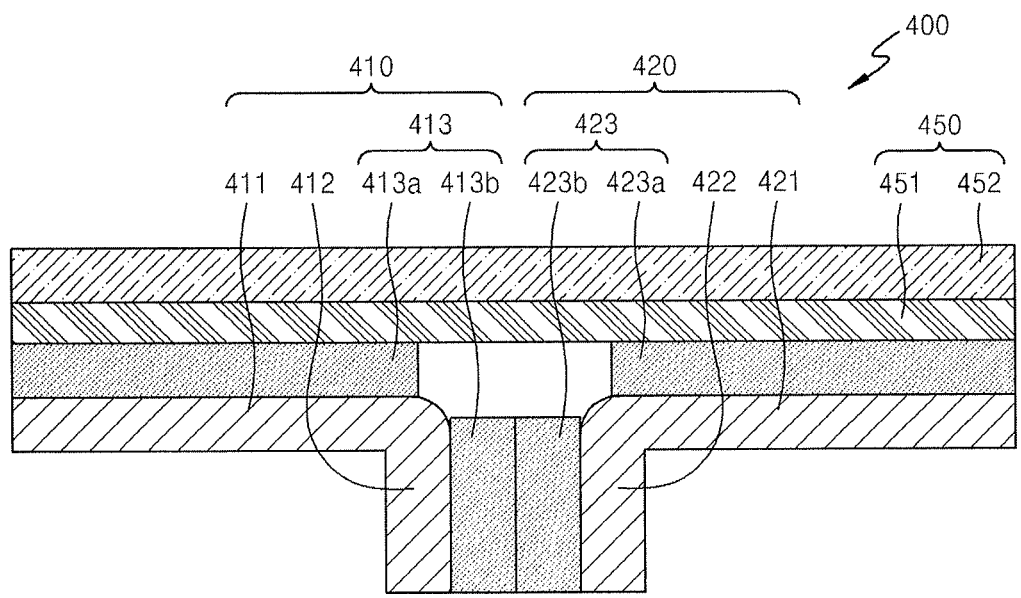
FIG. 7 is a cross-sectional view of a panorama display device according to another embodiment.

FIG. 7 is a cross-sectional view of a panorama display device 400 according to another embodiment.

Referring to FIG. 7, the panorama display device 400 may include a first display device 410, a second display device 420, and a connecting member 450. The first display device 410 includes a first display panel 411, a first polarization unit 413, and a first bezel portion 412, and the second display device 420 includes a second display panel 421, a second polarization unit 423, and a second bezel portion 422. The first display device 410, the second display device 420, and the connecting member 450 are substantially the same as those of the previous embodiment, and thus, detailed descriptions thereof will not be repeated.

Preparing of First Display Panel and Second Display Panel in order to manufacture the panorama display device 400, the first and second display devices 410 and 420 are prepared. Here, the first and second display devices 410 and 420 may be manufactured in the same way as that of the previous embodiment, and thus, detailed descriptions will not be repeated here.

In detail, as described above, the first display panel 411 is prepared, and the first polarization unit 413 that is formed as a film may be attached to the first display panel 411. In addition, the second display panel 421 is prepared, and the second polarization unit 423 that is formed as a film may be attached to the second display panel 421.

Cutting of First Polarization Unit and Second Polarization Unit

When the first and second display devices 410 and 420 are prepared as described above, the first polarization unit 413 and the second polarization unit 423 may be cut. Here, since the process of cutting the first and second polarization units 413 and 423 is substantially the same as that of the previous embodiment, a detailed description will not be repeated.

As described above, when the first and second polarization units 413 and 423 are cut, the first polarization unit 413 may be separated into a first polarization member 413a and a second polarization member 413b. In addition, the second polarization unit 423 may be separated into a third polarization member 423a and a fourth polarization member 423b.

Connecting First Display Panel and Second Display Panel to Each Other

When the coupling operation is finished, the first and second display panels 411 and 421 may be hinged with each other. Here, the method of hinging the first and second display panels 411 and 421 with each other is substantially the same as that of the previous embodiment, and thus, detailed descriptions will not be repeated.

As described above, the connecting member 450 may be formed on the first and third polarization members 413a and 423a. The connecting member 450 may be formed by sequentially forming an OCA 451 and a glass member 452, or the OCA 451 and a TSP.

By forming the connecting member 450 on the first and third polarization members 413a and 423a, the first and second display devices 410 and 420 may be connected to each other.

In particular, when the first and second display devices 410 and 420 are connected to each other via the connecting member 450, the first and second bezel portions 412 and 422 may be hinged with each other and may be disposed between the first display panel 411 and the second display panel 421.

The first and second bezel portions 412 and 422 may be hinged with each other to face each other, and may be disposed inside of the connecting member 450.

Therefore, according to the panorama display device 400 of the present embodiment, loss of an image on the connecting portion between the two display devices 410 and 420 may be reduced by bending and hinging the first and second bezel portions 412 and 422 formed on the display devices 410 and 420. In particular, according to the panorama display device 400, the first and second display devices 410 and 420 may be firmly connected to each other by using the connecting member 450.

Figure 8:
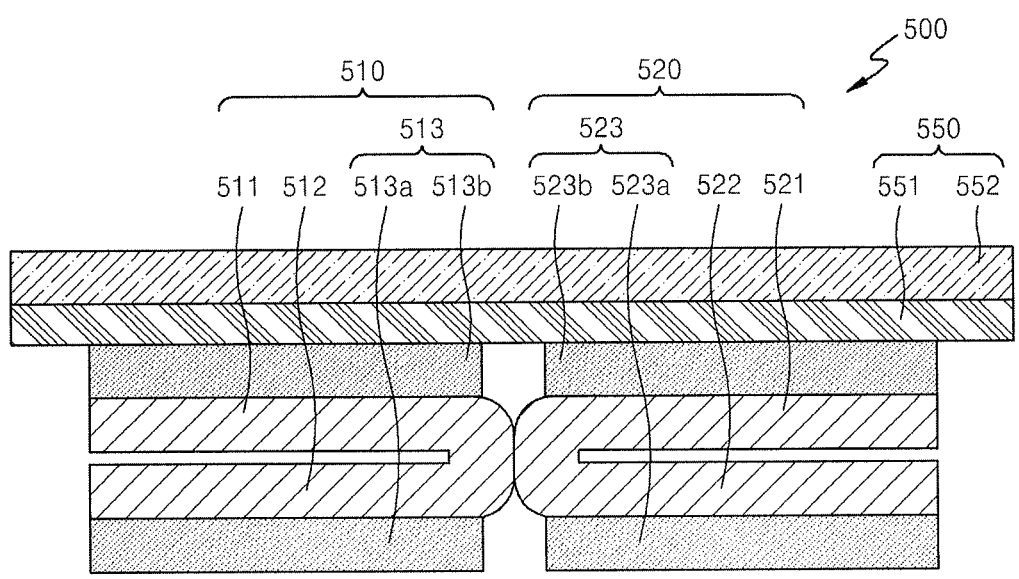
FIG. 8 is a cross-sectional view of a panorama display device according to another embodiment.

FIG. 8 is a cross-sectional view of a panorama display device 500 according to another embodiment.

Referring to FIG. 8, the panorama display device 500 may include a first display device 510, a second display device 520, and a connecting member 550. The first display device 510 includes a first display panel 511, a first polarization unit 513, and a first bezel portion 512, and the second display device 520 includes a second display panel 521, a second polarization unit 523, and a second bezel portion 522. Here, the first display device 510, the second display device 520, and the connecting member 550 are substantially the same as those of the previous embodiment, and thus, detailed descriptions thereof will not be repeated.

Preparing of First Display Panel and Second Display Panel

In order to manufacture the panorama display device 500, the first and second display devices 510 and 520 are prepared. Here, the first and second display devices 510 and 520 may be manufactured in the same way as that of the previous embodiment, and thus, detailed descriptions will not be repeated here.

In detail, as described above, the first display panel 511 is prepared, and the first polarization unit 513 that is formed as a film may be attached to the first display panel 511. In addition, the second display panel 521 is prepared, and the second polarization unit 523 that is formed as a film may be attached to the second display panel 521.

Cutting of First Polarization Unit and Second Polarization Unit

When the first and second display devices 510 and 520 are prepared as described above, the first polarization unit 513 and the second polarization unit 523 may be cut. Here, since the process of cutting the first and second polarization units 513 and 523 is substantially the same as that of the previous embodiment, a detailed description will not be repeated.

As described above, when the first and second polarization units 513 and 523 are cut, the first polarization unit 513 may be separated into a first polarization member 513a and a second polarization member 513b. In addition, the second polarization unit 523 may be separated into a third polarization member 523a and a fourth polarization member 523b.

Connecting First Display Panel and Second Display Panel to Each Other

When the coupling operation is finished, the first and second display panels 511 and 521 may be hinged with each other. Here, the first and second display panels 511 and 521 may be hinged with each other so that rear surfaces of the hinged portions contact each other.

In detail, when the hinge operation is performed as described above, the first display panel 511 may be hinged so that a partial rear surface of the portion where the first polarization member 513a is formed and a rear surface of the first bezel portion 512 where the second polarization member 513b is formed may contact each other.

Also, the second display panel 521 may be hinged so that a partial rear surface of the portion where the third polarization member 523a is formed and a rear surface of the second bezel portion 522 where the fourth polarization member 523b is formed may contact each other.

When finishing the above process, the connecting member 550 may be formed on the first and third polarization members 513a and 523a. Here, the connecting member 550 may be formed by sequentially forming an OCA 551 and a glass member 552, or the OCA 551 and a TSP.

As described above, the first and second display devices 510 and 520 may be connected to each other by forming the connecting member 550 on the first and third polarization members 513a and 523a to be connected to each other.

Therefore, according to the panorama display device 500, loss of an image on the connecting portion may be reduced by bending and hinging the first and second bezel portions 512 and 522 formed on the display devices 510 and 520, and connecting the bezel portions 512 and 522 to each other. In particular, according to the panorama display device 500, the first and second display devices 510 and 520 may be firmly connected to each other once again by the connecting member 550.

By way of summation and review, in a flexible display device including a bezel, a viewer may feel as if a screen is reduced in size due to the bezel portion. However, it is difficult to remove the bezel portion in order to address this problem, due to a limitation in manufacturing processes.

In addition, when a panorama display device is manufactured by connecting a plurality of flexible display devices to each other, displayed images may be discontinuous due to the bezel portions formed on the display panels. In addition, the discontinuity of the screen may happen regardless of how small the bezel portions are.

In contrast, embodiments provide a panorama display device, and a method of manufacturing the panorama display device, capable of minimizing a screen loss. According to embodiments, the bezel portions formed on the display devices are bent and hinged with each other to be connected to each other, and thus, loss of an image on the connecting portion may be reduced. Also, a visibility of a viewer may be improved by using the display devices after hinging the bezel portions with each other.

While the present invention has been particularly shown and described with reference to exemplary embodiments thereof, it will be understood by those of ordinary skill in the art that various changes in form and details may be made therein without departing from the spirit and scope as defined by the following claims.

What is claimed is:

1. A panorama display device, comprising:
a first display panel that is flexibly hinged to provide a hinged part and a non-hinged part of the first display panel, the hinged part of the first display panel being a portion of the first display panel that is bendable with respect to the non-hinged part of the first display panel;
a first polarization unit on the first display panel, the first polarization unit including a separated part that is on the hinged part of the first display panel and separated from a remaining part of the first polarization unit;
a second display panel that is flexibly hinged to provide a hinged part and a non-hinged part of the second display panel, the hinged part of the second display panel being a portion of the second display panel that is bendable with respect to the non-hinged part of the second display panel; and
a second polarization unit on the second display panel, the second polarization unit including a separated part that is on the hinged part of the second display panel and separated from a remaining part of the second polarization unit;
wherein:
the first and second display panels are connected to each other.

2. The panorama display device of claim 1, further comprising an adhesive member between the separated part of the first polarization unit and the separated part of the second polarization unit, the adhesive member attaching the first and second polarization units to each other.

3. The panorama display device of claim 1, further comprising a coupling member surrounding the hinged part of the first display panel and the hinged part of the second display panel to couple the first and second display panels to each other.

4. The panorama display device of claim 1, further comprising a connecting member formed on the remaining part of the first polarization unit and the remaining part of the second polarization unit.

5. The panorama display device of claim 4, wherein the connecting member includes at least one of an optically clear adhesive (OCA), a glass member, and a touch screen panel (TSP).

6. The panorama display device of claim 1, further comprising a bezel portion on at least one of the first and second display panels.

7. The panorama display device of claim 6, wherein at least one of the separated part of the first polarization unit and the separated part of the second polarization unit is located on the bezel portion.

8. The panorama display device of claim 1, wherein at least one of the first polarization unit and the second polarization unit is formed by sequentially stacking triacetate cellulose (TAC), polyvinyl alcohol (PVA), TAC, and a retardation film.

9. A method of manufacturing a panorama display device, the method comprising:
preparing a first display panel and a second display panel, and preparing a first polarization unit on the first display panel and a second polarization unit on the second display unit;
cutting the first polarization unit and the second polarization unit by as much as thicknesses of the first and second polarization units to provide a separated part of the first polarization unit separated from a remaining part of the first polarization unit and a-separated part of the second polarization unit separated from a remaining part of the second polarization unit;
hinging the first and second display panels to provide a hinged and a non-hinged portion of the first display panel and a hinged portion and a non-hinged portion of the second display panel, the hinged part of the first display panel being a portion of the first display panel that is bendable with respect to the non-hinged part of the first display panel and, the hinged part of the second display panel being a portion of the second display panel that is bendable with respect to the non-hinged part of the second display panel, the separated part of the first polarization unit being on the hinged part of the first display panel and the separated part of the second polarization unit being on the hinged part of the second display panel, and
connecting the first and second display panels to each other.

10. The method of claim 9, wherein at least one of the first and second polarization units is cut by a laser or a cutting wheel.

11. The method of claim 9, wherein:
connecting the first and second display panels to each other includes coupling the separated part of the first polarization unit and the separated part of the second polarization unit to each by an adhesive member.

12. The method of claim 9, wherein the hinged portion of the first display panel, the-separated part of the first polarization unit, the hinged portion of the second display panel, and the separated part of the second polarization unit are fixed by using a coupling member.

13. The method of claim 9, further comprising fixing the first display panel and the second display panel by forming a connecting member on the non-hinged portion of the first polarization unit and the non-hinged portion of the second polarization unit.

14. The method of claim 13, wherein the connecting member includes at least one of an optically clear adhesive (OCA), a glass member, and a touch screen panel (TSP).

* * * * *